(12) United States Patent
Qiu et al.

(10) Patent No.: US 9,915,000 B2
(45) Date of Patent: Mar. 13, 2018

(54) METHOD AND AN APPARATUS FOR DEPOSITING A LAYER ONTO A WORKPIECE USING PLASMA

(71) Applicant: NATIONAL UNIVERSITY OF SINGAPORE, Singapore (SG)

(72) Inventors: Xuepeng Qiu, Singapore (SG); Hyunsoo Yang, Singapore (SG); Young Jun Shin, Singapore (SG)

(73) Assignee: National University of Singapore, Singapore (SG)

( * ) Notice: Subject to any disclaimer, the term of this patent is extended or adjusted under 35 U.S.C. 154(b) by 215 days.

(21) Appl. No.: 14/401,078

(22) PCT Filed: May 16, 2013

(86) PCT No.: PCT/SG2013/000200
§ 371 (c)(1),
(2) Date: Nov. 13, 2014

(87) PCT Pub. No.: WO2013/172791
PCT Pub. Date: Nov. 21, 2013

(65) Prior Publication Data
US 2015/0284850 A1    Oct. 8, 2015

Related U.S. Application Data

(60) Provisional application No. 61/647,622, filed on May 16, 2012.

(51) Int. Cl.
*H05H 1/24*   (2006.01)
*C23C 16/50*   (2006.01)
(Continued)

(52) U.S. Cl.
CPC ............ *C23C 16/50* (2013.01); *C23C 14/185* (2013.01); *C23C 14/225* (2013.01); *C23C 14/34* (2013.01); *C23C 16/458* (2013.01); *C23C 16/48* (2013.01)

(58) Field of Classification Search
CPC ....... C23C 16/50; C23C 16/458; C23C 16/48; C23C 14/185; C23C 14/225
See application file for complete search history.

(56) References Cited

U.S. PATENT DOCUMENTS 5,302,266 A * 4/1994 Grabarz ................ C23C 14/046
                                                                  118/723 MR
5,622,567 A * 4/1997 Kojima ................. C23C 14/022
                                                                  118/726
(Continued)

FOREIGN PATENT DOCUMENTS

KR    10-2004-0013977 A    2/2004

OTHER PUBLICATIONS

Ducros et al. Deposition, characterization and machining performance of multilayer PVD coatings on cemented carbide cutting tools, Surface and Coatings Technology 163-164 (2003) 681-688.*

*Primary Examiner* — Kelly M Gambetta
(74) *Attorney, Agent, or Firm* — Casimir Jones S.C.; Tyler J. Sisk

(57) ABSTRACT

Various embodiments relate a method for depositing a layer onto a workpiece using plasma. The method comprises arranging the workpiece and a source material inside a vacuum chamber. The method also comprises applying energy to the source material to cause atoms of the source material to be ejected from a surface of the source material into a plasma. The method further comprises orientating the workpiece with respect to the source material to prevent direct propagation of the ejected atoms from the source material to a work surface of the workpiece and to permit (Continued)

deposition of the layer onto the workpiece by ejected atoms which impact the work surface after colliding with particles of the plasma. Various embodiments also provide a corresponding apparatus.

8 Claims, 9 Drawing Sheets

(51) Int. Cl.
*C23C 14/18* (2006.01)
*C23C 14/22* (2006.01)
*C23C 14/34* (2006.01)
*C23C 16/458* (2006.01)
*C23C 16/48* (2006.01)

(56) References Cited

U.S. PATENT DOCUMENTS

| | | |
|---|---|---|
| 6,001,748 A | 12/1999 | Tanaka et al. |
| 2006/0233969 A1 | 10/2006 | White et al. |
| 2008/0050910 A1* | 2/2008 | Hart ................... C23C 14/22 438/622 |
| 2010/0015813 A1 | 1/2010 | McGinnis et al. |

* cited by examiner

METHOD AND AN APPARATUS FOR DEPOSITING A LAYER ONTO A WORKPIECE USING PLASMA

TECHNICAL FIELD

Various embodiments relate a method and an apparatus for depositing a layer onto a workpiece using plasma. A specific embodiment relates to depositing a layer onto graphene by sputtering.

BACKGROUND

It is known to deposit a layer of material onto a base material (also known as an intermediate material). Such techniques are frequently used in the semiconductor industry to apply coatings or films. Problems can arise when the intermediate material is thin. Traditional deposition techniques can cause damage to the intermediate material because the energy of particles hitting the material's surface during deposition of the layer may cause damage to the intermediate material. Whilst thicker materials may only suffer surface damage, thin materials may suffer damage throughout most or all of its thickness.

Graphene is a flat monolayer of carbon atoms packed into a honeycomb lattice. Graphene has attracted considerable attention due to its peculiar and superior electronic, optical, thermal, mechanical properties characteristics. The important properties of graphene include high intrinsic charge carrier mobility and tunability of its properties by applying a gate voltage. The properties of graphene are at its best when graphene is pristine, i.e. absent of any damage. However, as graphene is only one monolayer of carbon atoms, the C—C bonds thereof are easily broken during deposition of layers thereon. Therefore, only thermal evaporation is known to be suitable for deposition of a layer onto graphene. This greatly limits the choice of materials or layers in graphene devices.

Sputter deposition is a method of depositing films by sputtering. Sputtering is a process whereby atoms are ejected from a solid source material (also known as a target material) due to bombardment of the source material by energetic plasma particles. The ejected atoms can be deposited on a surface of a workpiece to form a film thereon. Sputtering is a widely used technique in the hard-disk drive industry and in the spintronics and optoelectronics sector, for example, to form indium-tin-oxide coatings. However, sputtering is known to be unsuitable for depositing films onto graphene because the ejected atoms from the source material bombard the graphene with enough energy to cause disorder into graphene. This degrades the graphene and leads to it being non-pristine.

SUMMARY

A first aspect provides a method for depositing a layer onto a workpiece using plasma, the method comprising: arranging the workpiece and a source material inside a vacuum chamber; applying energy to the source material to cause atoms of the source material to be ejected from a surface of the source material into a plasma; orientating the workpiece with respect to the source material to prevent direct propagation of the ejected atoms from the source material to a work surface of the workpiece and to permit deposition of the layer onto the workpiece by ejected atoms which impact the work surface after colliding with particles of the plasma.

In an embodiment, the step of applying comprises: introducing the plasma into the vacuum chamber; and electrically charging the source material to cause ions of the plasma to bombard the surface of the source material to cause atoms of the source material to be ejected from the surface of the source material.

In an embodiment, the step of introducing comprises: injecting a gas into the vacuum chamber; and electrically charging the gas to generate the plasma.

In an embodiment, a pressure in the vacuum chamber is selected from group consisting of: 5 to 50 mTorr, 10 to 40 mTorr, 15 to 35 mTorr, 20 to 30 mTorr, 15 to 25 mTorr, 25 to 50 mTorr, 30 to 40 mTorr.

In an embodiment, the step of applying comprises causing energized particles from an energy source to bombard the surface of the source material to form the plasma and cause atoms of the source material to be ejected from the surface.

In an embodiment, the step of applying comprises shining a laser onto the surface of the source material to cause atoms of the source material to be vaporized into a plume of plasma.

In an embodiment, the step of applying comprises applying an electric arc to the surface of the source material to cause atoms of the source material to be ejected from the surface into plasma discharged by the arc.

In an embodiment, the workpiece comprises a substrate having an intermediate material on a surface thereof, an outer surface of the intermediate material being the work surface, the intermediate material having a thickness selected from the group consisting of: 0.1 to 50 nm, 0.1 to 10 nm, 0.1 to 5 nm, 0.1 to 1 nm, 0.5 to 20 nm, 1 to 2 nm, 0.1 to 2 nm, 0.5 to 5 nm, 10 to 50 nm, 20 to 50 nm.

In an embodiment, the intermediate material is graphene.

In an embodiment, the workpiece is orientated to prevent straight-line propagation of the ejected atoms from the source material to the work surface.

In an embodiment, the workpiece is orientated so that a plane of the workpiece is angled with respect to a plane of the source material and the work surface faces away from the source material, the angle being any one of the following: less that 80°, less that 70°, less that 60°, less that 50°, less that 40°, less that 30°, less that 20°, less that 15°, less that 10°, less that 5°.

In an embodiment, the plane of the workpiece is parallel with the plane of the source material.

In an embodiment, the method further comprises: orientating the workpiece with respect to the source material to permit direct propagation of the ejected atoms from the source material to the work surface of the workpiece to deposit a further layer onto the workpiece.

In an embodiment, the workpiece is arranged above the source material.

A second aspect provides an apparatus for depositing a layer onto a workpiece using plasma, the apparatus comprising: a vacuum chamber configured in use to house a source material and the workpiece; an energy source configured in use to apply energy to the source material to cause atoms of the source material to be ejected from a surface of the source material into a plasma; a workpiece holder configured in use to hold the workpiece and orientate the workpiece with respect to the source material to prevent direct propagation of the ejected atoms from the source material to a work surface of the workpiece and to permit deposition of the layer onto the workpiece by ejected atoms which impact the work surface after colliding with particles of the plasma.

In an embodiment, the vacuum chamber comprises an inlet, the inlet comprising a one-way value to permit fluid entering the vacuum chamber but prevent fluid leaving the vacuum chamber.

In an embodiment, the energy source comprises a gas charger configured in use to electrically charge a gas injected into the vacuum chamber via the inlet to generate plasma.

In an embodiment, the energy source further comprises a source charger configured in use to electrically charge the source material to cause ions of the plasma to bombard the surface of the source material to cause atoms of the source material to be ejected from the surface of the source material.

In an embodiment, the energy source is configured in use to bombard the surface of the source material with energized particles to form the plasma and cause atoms of the source material to be ejected from the surface.

In an embodiment, the energy source comprises a laser configured in use to irradiate the surface of the source material to cause atoms of the source material to be vaporized into a plume of plasma.

In an embodiment, the energy source comprises an electric arc generator configured in use to discharge an electric arc onto the surface of the source material to cause atoms of the source material to be ejected from the surface into plasma discharged by the arc.

In an embodiment, the workpiece comprises a substrate having an intermediate material on a surface thereof, an outer surface of the intermediate material being the work surface, the intermediate material having a thickness selected from the group consisting of: 0.1 to 10 nm, 1 to 2 nm, 0.1 to 2 nm, 2 to 5 nm.

In an embodiment, the intermediate material is graphene.

In an embodiment, the workpiece holder is configured in use to orientate the workpiece with respect to the source material to prevent straight line propagation of the ejected atoms from the source material to the work surface.

In an embodiment, the workpiece holder is configured in use to orientate the workpiece so that a plane of the workpiece is angled with respect to a plane of the source material and the work surface faces away from the source material, the angle being any one of the following: less that 80°, less that 70°, less that 60°, less that 50°, less that 40°, less that 30°, less that 20°, less that 15°, less that 10°, less that 5°.

In an embodiment, the workpiece holder is configured in use to orientate the workpiece so that the plane of the workpiece is parallel with the plane of the source material.

In an embodiment, the workpiece holder is moveable in use to orientate the workpiece with respect to the source material to permit direct propagation of the ejected atoms from the source material to the work surface of the workpiece to deposit a further layer onto the workpiece.

In an embodiment, the workpiece holder is configured in use to hold the workpiece above the source material.

BRIEF DESCRIPTION OF THE DRAWINGS

Embodiments of the invention will be better understood and readily apparent to one of ordinary skill in the art from the following written description, by way of example only, and in conjunction with the drawings, wherein like reference signs relate to like components, in which:

FIGS. 7 (a) and (b) illustrate surface morphology over 1.5×1.5 μm$^2$ and FIGS. 7 (c) and (d) illustrate a line profile;

DETAILED DESCRIPTION

Throughout this disclosure, certain embodiments may be disclosed in a range format. It should be understood that the description in range format is merely for convenience and brevity and should not be construed as an inflexible limitation on the scope of the disclosed ranges. Accordingly, the description of a range should be considered to have specifically disclosed all the possible sub-ranges as well as individual numerical values within that range. For example, description of a range such as from 1 to 6 should be considered to have specifically disclosed sub-ranges such as from 1 to 3, from 1 to 4, from 1 to 5, from 2 to 4, from 2 to 6, from 3 to 6 etc., as well as individual numbers within that range, for example, 1, 2, 3, 4, 5, and 6. This applies regardless of the breadth of the range.

Various embodiments relate a method and an apparatus for depositing a layer onto a workpiece using plasma.

Figure 1:
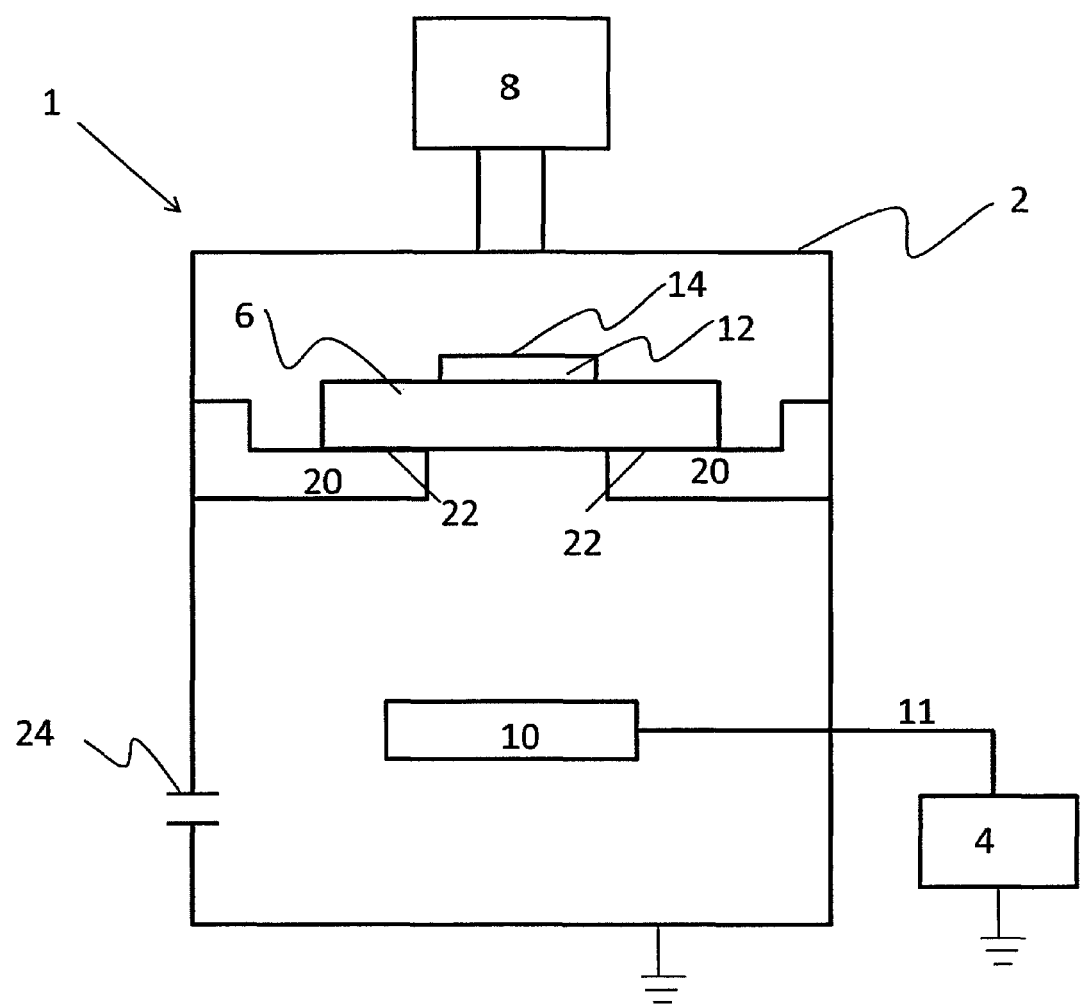
FIG. 1 is a cross-section schematic diagram of an apparatus in accordance with an embodiment.

FIG. 1 illustrates an apparatus 1 for depositing a layer onto the workpiece using plasma, in accordance with an embodiment. The apparatus 1 comprises a vacuum chamber 2, an energy source 4, and a workpiece holder 6.

The vacuum chamber 2 comprises a sealed enclosed space capable of maintaining a vacuum. In an embodiment, the enclosed space of the vacuum chamber 2 may be in fluid communication with a vacuum pump 8. The vacuum pump 8 may be used to extract matter from the enclosed space to form a partial or complete vacuum. The fluid connection between the enclosed space of the vacuum chamber 2 and the vacuum pump 8 may comprise a one-way value (not shown) to prevent extracted matter re-entering the vacuum chamber 2. The precise position of the vacuum pump 8 and its connection to the vacuum chamber 2 may vary between different embodiments.

The vacuum chamber 2 may be configured in use to house a source material 10 (sometimes called a target material) and a workpiece 12. The term 'workpiece' may be understood to mean an object or article onto which a layer (i.e. a coating or film) of material is to be deposited in accordance with an embodiment. The term 'work surface' may be understood to mean a specific surface of the workpiece onto which the layer is to be deposited.

The source material 10 may be held in position inside the vacuum chamber 2 by an arm 11. The source material 10 may be positioned in a lower portion of the vacuum chamber 2. In an alternative embodiment, the source material may rest on a surface of the vacuum chamber 2, for example, a bottom internal surface. In yet another embodiment, the source material may be held in position by a source holder (not shown). The source holder may be removeably attached to an inner surface of the vacuum chamber 2. For example, the source holder may be attached to the vacuum chamber 2 by a mechanism, such as, a snap-on, screw-in or slot-in mechanism. The source material 10 may comprise one or more different materials depending on the composition of the layer to be deposited onto the work surface of the workpiece 12. For example, the source material 10 may comprise cobalt (Co) if the layer to be deposited is a Co layer, or Co and iron (Fe) if the layer to be deposited is a CoFe layer. In the above-described embodiment, only source material 10 is present. However, in some other embodiments there can be multiple source materials 10 in the vacuum chamber 2.

In use, the source material 10 may be subjected to energy from the energy source 4 so that atoms of the source material 10 are ejected from the source material 10 into a plasma. As seen more particularly on FIG. 1, the energy source 4 may take the form of an electric power supply for delivering electric energy to the source material 10 to charge the source material 10. In this sense, the power supply may be understood to be a source charger since it charges the source material. The electric charge on the source material 10 may be a negative electric charge. The power supply may be connected to the source material 10 via a connection cable (not shown). For example, the connecting cable may run through the arm 11 or the arm 11 may be the connection cable. The vacuum chamber 2 may be grounded to generate a potential difference between the source material 10 and the vacuum chamber 2. Additionally, the vacuum chamber 2 may include an inlet 24 in a wall thereof. The precise location of the inlet 24 may vary between different embodiments. The inlet 24 may be used to inject a gas into the sealed enclosed space of the vacuum chamber 2. The gas may be an inert gas, such as, argon (Ar) gas. The gas may include other elements, such as, oxygen ($O_2$) and/or nitrogen ($N_2$). The material composition of the gas may be chosen in dependence on the material composition of the layer to be deposited. The presence of the gas with the potential difference causes the gas to form a plasma. Plasma contains different plasma particles (e.g. neutral gas atoms, ions, electrons, and photons) which simultaneously exist in a near balanced state. In this sense, the power supply may be understood to be a gas charger since it charges the gas to form plasma. Since the source material 10 is charged, the plasma ions are attracted to the source material 10 and bombard its surface. The impact of these plasma ions causes atoms of the source material 10 to be ejected from the surface into the plasma. In an alternative embodiment, plasma may be injected into the vacuum chamber 2 via the inlet 24, rather than formed in the vacuum chamber 2 by charging a gas. The deposition method may be sputtering.

In another embodiment, the energy source 4 may be a laser so that energy is provided to the source material 10 in the form of incident laser light. Shining a laser onto the surface of the source material 10 causes atoms of the source material 10 to be vaporized into a plume of plasma. The deposition method may be pulsed laser deposition. In a further embodiment, the energy source 4 may be an electric arc generator so that energy is provided to the source material 10 in the form of an incident electric arc. Applying an electric arc to the surface of the source material 10 causes atoms of the source material 10 to be ejected from the surface into plasma discharged by the arc. The deposition method may be cathodic arc deposition.

The workpiece 12 may comprise a substrate. The substrate may have an intermediate material on a surface thereof. For example, the intermediate material may be a coating or a film on the substrate. An outer surface of the intermediate material may provide a work surface 14 of the workpiece 12. In an embodiment, the substrate may be a layer of silicon. In an embodiment, the intermediate material may have a thickness selected from the group consisting of: 0.1 to 50 nm, 0.1 to 10 nm, 0.1 to 5 nm, 0.1 to 1 nm, 0.5 to 20 nm, 1 to 2 nm, 0.1 to 2 nm, 0.5 to 5 nm, 10 to 50 nm, 20 to 50 nm. Accordingly, the work surface 14 of the workpiece 12 may be very fragile due to its thinness. In an embodiment, the intermediate material may be a coating of graphene applied to a top surface of the substrate.

Figure 2:
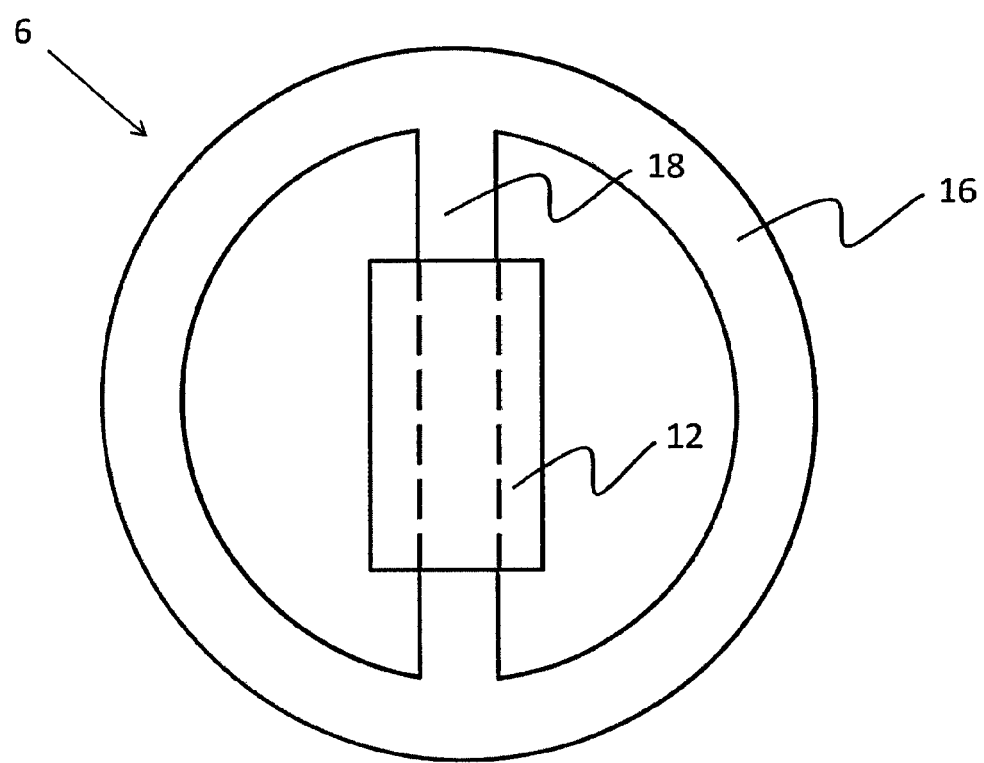
FIG. 2 is a top view schematic diagram of a workpiece holder in accordance with an embodiment.

The workpiece 12 is held in the vacuum chamber 2 by the workpiece holder 6. In an embodiment, the workpiece holder 6 may be removeably positioned in the vacuum chamber 2. For example, the workpiece holder 6 may be attachable to the vacuum chamber 2 by a mechanism, such as, a snap-on, screw-in or slot-in mechanism. As seen more particularly in FIG. 2, in an embodiment, the workpiece holder 6 may comprise a frame having a circular outer ring 16 and a bar 18 running though the center of the ring and attached at each end to the ring. The bar 18 may be configured to attach to the workpiece 12, for example, via an adhesive (e.g. double-sided tape) or a locking mechanism (not shown). Alternatively, the workpiece 12 may just rest on the bar 18. Also, the vacuum chamber 2 may comprise a shelf 20 having a cooperating slot or groove 22 for receiving the workpiece holder 6 so that the workpiece holder 6 can be repeatably and removably positioned in the vacuum chamber 2 at a fixed position from the source material 10. It is to be understood that the shelf 20 would comprise a circular aperture having a slot around its inside edge in order to cooperate with the circular workpiece holder of FIG. 2. However, in other embodiments, the workpiece holder and shelf aperture could have a different shape, for example, oval, square, triangular or irregular. In an embodiment, the workpiece holder 6 has a construction which permits particles (e.g. ejected atoms) to move through the workpiece holder 6. For example, the workpiece holder 6 of FIG. 2 has a framed construction such that two semi-circular apertures are present either side of the bar 18. These two apertures allow particles to move through the workpiece holder 6. In this way, ejected atoms can reach the work surface 14 from the source material 10. However, in another embodiment, the workpiece holder 6 may have a more solid construction, but have a plurality of holes for allowing the passage of particles through the workpiece holder 6. In a further embodiment, the shelf 20 may have one or more apertures to permit the passage of particles from the source material 10 to the work surface 14.

In any case, according to the above arrangement, the workpiece holder 6 can be removed from the vacuum chamber 2 so that the workpiece 12 can be disengaged therefrom, for example, once deposition is complete. In order that the workpiece holder 6 can be removed from the vacuum chamber 2, the vacuum chamber 2 may comprise a sealable hatch (not shown) which can be opened so that a human user or a machine can lift the workpiece holder 6 off the shelf 20 and out of the vacuum chamber 2 through the hatch. The hatch may be in a wall (e.g. a top wall or side wall) of the vacuum chamber 2 and be sealable to maintain the vacuum.

The apparatus 1 may be configured so that the workpiece holder 6 and the source material 10 are arranged in a fixed horizontal and/or vertical relationship. In an embodiment, the source material 10 may be aligned with, but vertically displaced from the workpiece holder 6. The distance between the workpiece holder 6 and the source material 10 may be fixed or may be adjustable by moving the workpiece holder 6 and/or the source material 10. For example, the shelf 20 may be vertically moveable within the vacuum chamber 2. In an embodiment, the workpiece holder 6 may be arranged directly above the source material 10.

Deposition of a layer onto the work surface 14 of the workpiece 12 occurs when atoms ejected from the source material 10 impact the work surface 14. An ejected atom which follows a straight line path from the source material 10 directly to the workpiece will have a lot of energy on impact. Accordingly, this energy may cause the ejected atom to damage the work surface 14 of the workpiece 12. However, since plasma is present in the vacuum chamber 2, an atom ejected from the source material 10 may collide with plasma particles before arriving at the workpiece 12. In fact, the ejected atom may undergo many collisions with plasma particles and/or other ejected atoms before arriving at the workpiece 12. In this way, the path of the ejected atom in question may be prolonged such that its energy at the point of impact with the workpiece 12 is reduced. The longer the path taken by the ejected atom in question and the more it collides, the less energy it has at the point of impact with the workpiece 12. The less energy the ejected atom has at impact with the workpiece 12, the less likely it is that the ejected atom will damage the workpiece 12 on impact.

Regardless of what specific arrangement is used to mount the workpiece holder 6 inside the vacuum chamber 2, the workpiece holder 6 is configured to orientate the workpiece 12 with respect to the source material 10 to prevent direct propagation of the ejected atoms from the source material 10 to a work surface 14 of the workpiece 12. Furthermore, the workpiece holder 6 is configured to orientate the workpiece 12 with respect to the source material 10 to permit deposition of the layer onto the workpiece by ejected atoms which impact the work surface after colliding with plasma particles. Ejected atoms may also collide with other ejected atoms. In the embodiment shown in FIG. 1, the workpiece holder 6 is configured in use to orientate the workpiece 12 so that a plane of the workpiece is parallel with a plane of the source material 10 and the work surface 14 faces away from the source material 10. Therefore, ejected atoms which travel from the source material 10, through the workpiece holder 6 and onto the work surface 14 contribute to layer deposition. Forcing ejected atoms to follow this indirect and prolonged path means that the energy of the ejected atoms at the point of impact with the work surface 14 is low enough to avoid damage to the work surface 14. It is thought that this path requires the ejected atom to go through enough collisions and travel enough distance to mean that the energy level of the ejected atom at the point of impact is low enough to avoid damage. Additionally, it is thought that the reversal, or substantial change, in direction necessary for the ejected atom to follow a path from the source material 10 to the work surface 14 reduces the energy of the ejected atom at the point of impact, thereby avoiding damage to the work surface 14. In an embodiment, only atoms ejected from the source material which collide (e.g. with plasma particles and/or other ejected atoms) are able to hit the work surface.

Direct propagation of the ejected atoms from the source material 10 to a work surface 14 of the workpiece 12 may be taken to mean movement of the ejected atoms in a substantially straight line from the source material 10 to the work surface 14 of the workpiece 12 without any collisions. An ejected atom which impacts the work surface 14 via direct propagation has enough energy to damage the work surface 14. Stated differently, the ejected atom has not had its energy dissipated by collisions or a longer path length.

Figure 3:
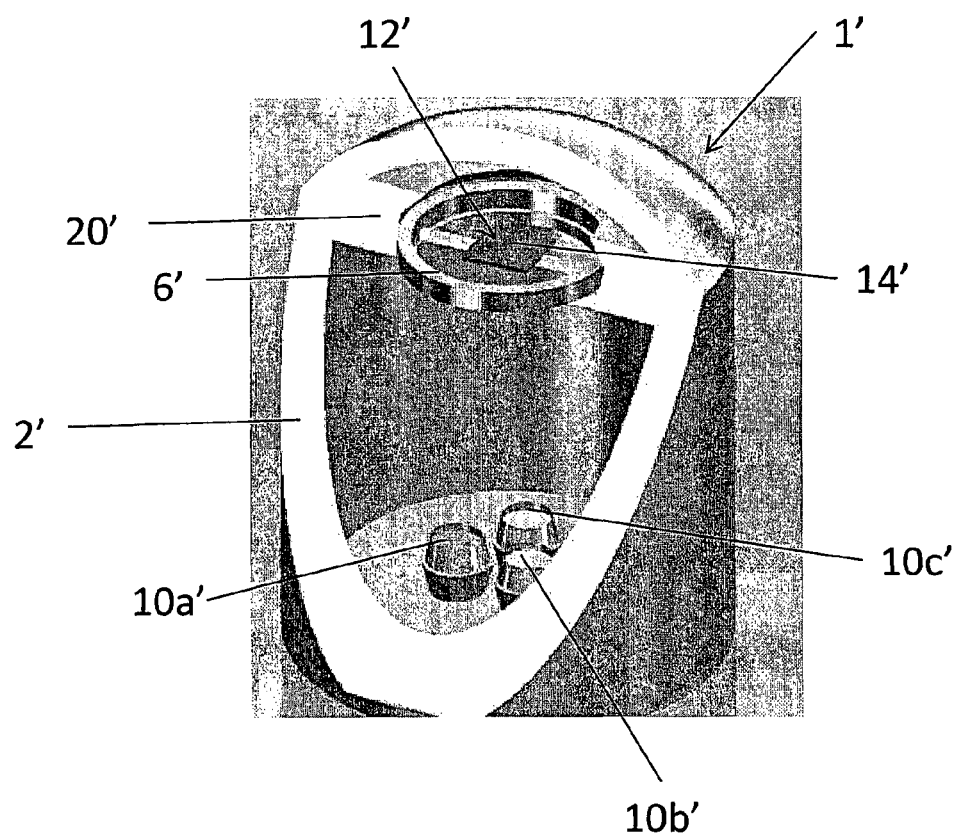
FIG. 3 is a cross-section schematic diagram of an apparatus in accordance with an embodiment.

FIG. 3 shows an apparatus 1' for depositing a layer onto a workpiece using plasma in accordance with an embodiment. Many features of the apparatus 1' of FIG. 3 are analogous to the above-described features of the apparatus 1 of FIG. 1.

Accordingly, the features of the apparatus 1' are labeled in a corresponding manner to those of the apparatus 1. The apparatus 1' is different from the apparatus 1 in that the apparatus 1' has three source materials 10a', 10b' and 10c'. Also, the source materials of the apparatus' 1' are resting on an inner surface of the base of the vacuum chamber 2'.

Figure 4:
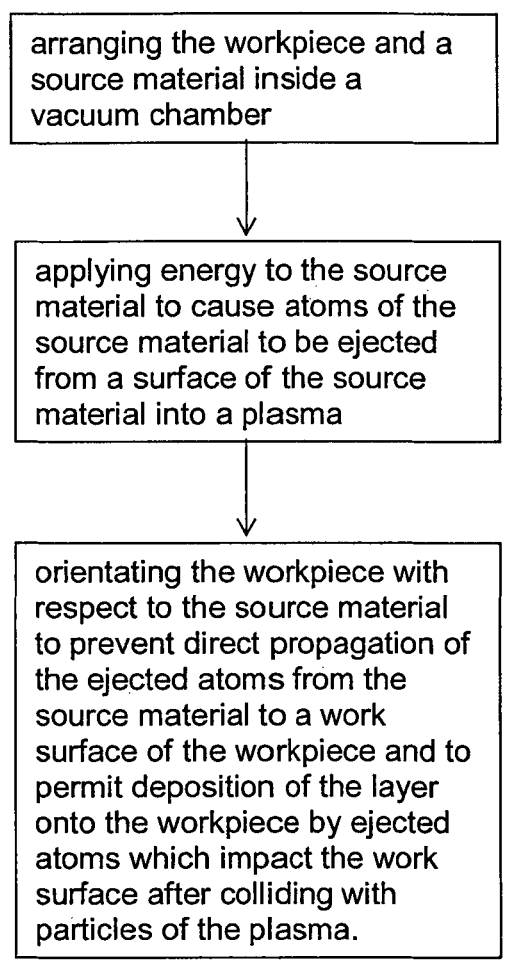
FIG. 4 is a flow diagram of a method in accordance with an embodiment.

FIG. 4 shows a flow diagram of a method 100 for depositing a layer onto a workpiece using plasma in accordance with an embodiment. The following describes the method of FIG. 4 in conjunction with the apparatus 1 of FIG. 1. However, it is to be understood that an alternative apparatus may be used to perform the method. At 102, the workpiece 12 and the source material 10 are arranged inside the vacuum chamber 2. As mentioned above, the workpiece 12 may be held in position inside the vacuum chamber 2 by a workpiece holder 6. Also, the position of the workpiece 12 may be vertically aligned with, but vertically displaced from the position of the source material 10. The workpiece 12 may be above the source material 10.

At 104, energy is applied to the source material 10 to cause atoms of the source material 10 to be ejected from the surface of the source material 10 into plasma. In one embodiment, energy from a laser may be shone onto the surface of the source material 10 to cause atoms of the source material 10 to be vaporized into a plume of plasma. In another embodiment, energy from an electric arc may be applied onto the surface of the source material 10 to cause atoms of the source material 10 to be ejected from the surface into plasma discharged by the arc. In yet another embodiment, energy from an electric power supply may charge the source material 10 to cause ions of plasma in the vacuum chamber 2 to bombard the surface of the source material 10 to cause atoms of the source material 10 to be ejected from the surface into the plasma. The plasma in the vacuum chamber 2 may be injected into the vacuum chamber 2, for example, via inlet 24. Alternatively, the plasma in the vacuum chamber 2 may be generated by injecting a gas into the vacuum chamber 2 then charging the gas using the electric power supply to form plasma. In a further embodiment, energized particles from an energy source may bombard the source material 10 to form plasma in the vacuum chamber 2 to cause atoms of the source material 10 to be ejected from the surface.

At 106, the workpiece is orientated with respect to the source material 10 to prevent direct propagation of the ejected atoms from the source material 10 to a work surface 14 of the workpiece 12 and to permit deposition of the layer onto the workpiece 12 by ejected atoms which impact the work surface 14 after colliding with particles of the plasma. Ejected atoms may also collide with other ejected atoms. In an embodiment, the workpiece 12 is substantially parallel with the source material 10, but the work surface 14 faces away from the source material 10. This arrangement forces ejected atoms which reach the work surface 14 to follow a path which requires them to travel a longer distance compared to a straight-line path, thereby reducing the energy of the ejected atom. This arrangement forces ejected atoms to undergo collisions with plasma particles and/or other ejected atoms, thereby reducing the energy of the ejected atom. In this way, the energy of the ejected atom at the point of impact with the work surface 14 is reduced enough to avoid damage to the work surface 14.

In an embodiment, the workpiece 12 may be orientated so that a plane of the workpiece 12 is angled with respect to a plane of the source material 10 and the work surface 14 faces away from the source material. The angle may be any one of the following: less that 80°, less that 70°, less that 60°, less that 50°, less that 40°, less that 30°, less that 20°, less that 15°, less that 10°, less that 5°. Accordingly, the workpiece 12 may not necessarily be parallel with the source material 10. For example, the workpiece 12 may be parallel with a tolerance of ±5°, ±10°, ±15°, ±20°, ±25°, ±30°, ±40°, ±50°, ±60°, ±70° or ±80°. In fact, the angle may be any angle which prevents direct propagation of ejected atoms from the source material 10 to the work surface 14. Accordingly, the angle may depend on a comparison between a shape or area of the surface of the source material 10 facing the workpiece 12 and a shape or area of the work surface 14 of the workpiece 12. For example, if the area of the source material 10 is much larger than the area of the work surface 14 the angle may need to be smaller, i.e. the workpiece 12 and the source material 10 should be closer to being parallel. Alternatively, if the area of the source material 10 is much smaller than the area of the work surface 14 the angle may need to be larger, i.e. the workpiece 12 should be closer to being perpendicular to the source material 10. However, being perpendicular or too close to perpendicular may allow direct propagation of ejected atoms from the source material 10 to the work surface 14.

In view of the above, ejected atoms with a direct line trajectory from the source material 10 to the workpiece 12 may not impact the work surface 14. In other words, ejected atoms with a direct line trajectory from the source material 10 to the workpiece 12 may impact a backside (i.e. opposite side to the work surface 14) of the workpiece 12. Therefore, collision of the ejected atoms with particles of the plasma and/or other ejected atoms will redirect the ejected atoms to impact the work surface 14 to deposit the layer onto the work surface 14. The ejected atoms may be redirected by collision one or more times before they reach the work surface 14 of the workpiece 12. Each collision will reduce the energy of the ejected atom and probably increase its path length.

As mentioned above, plasma may be introduced into the vacuum chamber 2 and the source material 10 may be charged to cause plasma ions to bombard the surface of the source material 10. In this way, atoms may be ejected from the source material which can be used to deposit a layer on the work surface 14. In an embodiment, the pressure in the vacuum chamber 2 may be selected from group consisting of: 5 to 50 mTorr, 10 to 40 mTorr, 15 to 35 mTorr, 20 to 30 mTorr, 15 to 25 mTorr, 25 to 50 mTorr, 30 to 40 mTorr. To generate this pressure inside the vacuum chamber 2, plasma may be introduced at a specific flow rate. Alternatively, a gas may be injected into the vacuum chamber 2 at a specific flow rate to form this pressure and then the gas may be charged to form plasma. It is noted that this pressure is much higher than in normal sputtering techniques which typically use a pressure of about 3 mTorr. Due to this increased pressure, the energy of plasma ions bombarding the source material 10 is reduced because those plasma ions are more likely to have lost energy by colliding with other plasma particles before impacting the source material 10. Therefore, the starting energy of ejected atoms as they leave the source material 10 may be reduced, thereby reducing the ending energy of the ejected atoms at impact with the work surface 14. Further, the probability that the ejected atoms from the source material 10 collide with particles of the plasma is increased because there are many more plasma particles to collide with. Therefore, the ending energy of the ejected atoms at impact with the work surface 14 may be reduced. Accordingly, the ejected atoms hitting the work surface 14 have less energy and, therefore, cause less damage to the work surface 14. Furthermore, since more plasma ions are present and bombarding the source material a larger number of ejected atoms is produced. In turn, this factor may improve the deposition rate.

In an embodiment, the method 100 may include a further step after the above-described steps 102 to 106 have been completed. In this further step, the workpiece 12 is orientated with respect to the source material 10 to permit direct propagation of the ejected atoms from the source material 10 to the work surface 14 of the workpiece 12 so as to deposit a further layer onto the workpiece 12. Accordingly, a first layer may be deposited on work surface 14 in accordance with above-described steps 102 to 106 and then, afterwards, a second layer may be deposited on the work surface 14 in accordance with the further step. An advantage of this further step is that once a protective layer has been gently applied to the work surface 14 in accordance with steps 102 to 106, a further layer can more quickly be applied on top of the first layer. During first layer deposition, the work surface 14 is protected from damage at the cost of a reduced deposition rate. During second layer deposition, the deposition rate can be increased without risking damage to the work surface 14. In an embodiment, the workpiece holder 6 may be removed from the shelf 20 and replaced so that the work surface 14 faces the source material 10. Alternatively, the workpiece holder 6 may be fixed to an inner wall of the vacuum chamber 2 by an arm (not shown) and configured in use to rotate the workpiece holder 6 until the work surface 14 faces the source material 10.

Figure 5:
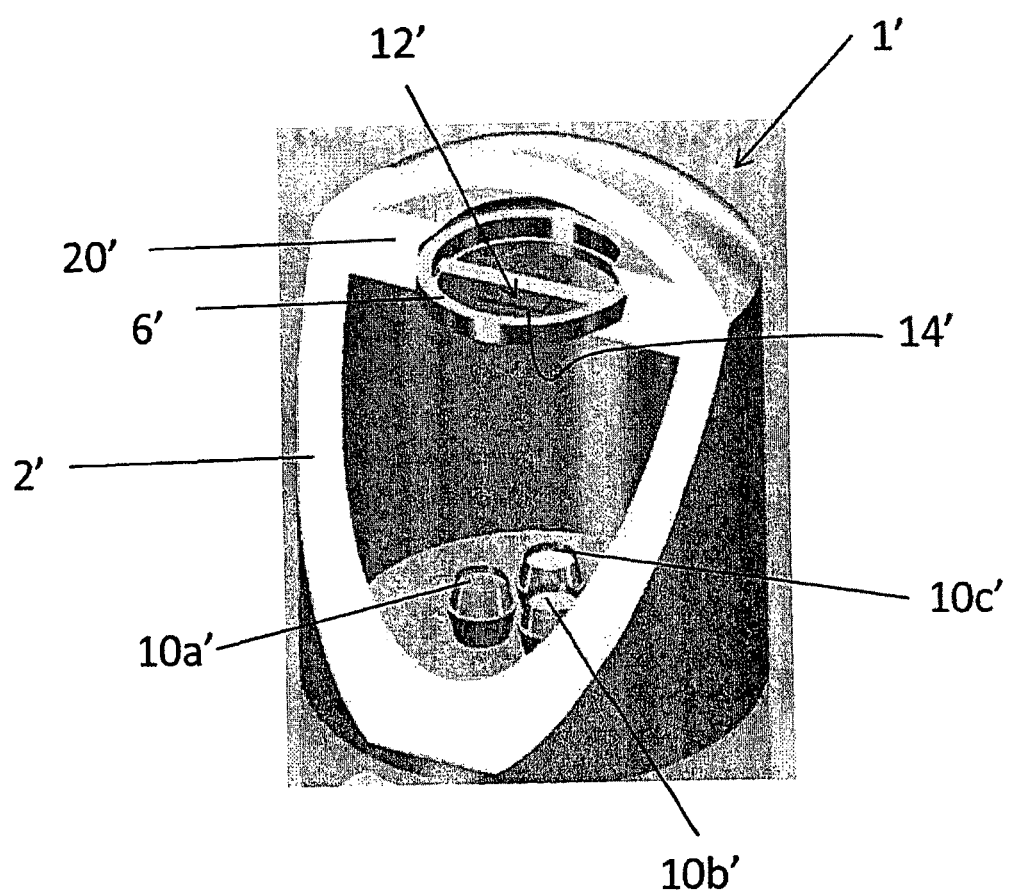
FIG. 5 is a cross-section schematic diagram of an apparatus in accordance with an embodiment.

FIG. 5 shows the apparatus 1' of FIG. 3 configured for deposition of the second layer. As can be seen on FIG. 5, the workpiece 12' is orientated with respect to the source materials 10a', 10b' and 10c' to permit direct propagation of the ejected atoms from the source materials 10a', 10b' and 10c' to the work surface 14' of the workpiece 12' so as to deposit a further layer onto the workpiece 12'.

Examples

A Cobalt iron (CoFe) layer, Aluminum (Al) layer and Magnesium oxide (MgO) layer were deposited on respective graphene workpieces by different types of sputtering using the method as described above.

Single layer graphene (SLG) was prepared by micromechanical exfoliation of Kish graphite. The SLG was subsequently transferred onto a highly p-doped Silicon (Si) substrate having thereon a layer of 300 nm thick Silicon-Dioxide ($SiO_2$) to form a graphene workpiece. The SLG was identified by an optical microscope and was confirmed using a 532 nm Raman spectrometer.

In the known prior art configuration of sputtering, direct propagation of ejected atoms from the source material onto the graphene work surface is permitted, i.e. the SLG faces the source material. In the present embodiment, the graphene workpiece is orientated so that a plane of the graphene workpiece is parallel with a plane of the source material and the graphene work surface faces away from the source material. The distance from the source material to the graphene work surface is fixed at 30 cm. The source material is vertically aligned with and below the graphene workpiece.

During all depositions described below, Ar gas pressures are set to 20 mTorr, which is much higher than the typical value of 3 mTorr used in conventional sputtering deposition. A high Ar gas pressure of 20 mTorr is used to increase the probability that (i) plasma atoms collide to reduce their energy before hitting the source material, and (ii) ejected atoms collide to reduce their energy before hitting the work surface. However, more ejected atoms are present due to the larger number of plasma ions hitting the source material. Accordingly, the number of ejected atoms is increased but the energy of the ejected atoms hitting the work surface is reduced.

To evaluate the physical property of the graphene workpiece, Raman spectroscopy was employed. The Raman spectra of graphene mainly consist of three peaks: D peak (~1350 cm$^{-1}$), G peak (~1580 cm$^{-1}$), and 2D peak (~2680 cm$^{-1}$). The G peak is due to the bond stretching of pairs of the sp$^2$ carbon atoms. The D peak is due to ring-breathing modes and is induced by disorder (i.e. damage) of graphene. The 2D line corresponds to a high-energy second-order process and is observed even in the absence of the D peak. The shape of the 2D peak and the ratio of intensity between the G peak ($I_G$) and 2D peak ($I_{2D}$) are used to discriminate SLG from multilayered graphene. Based on the shape and position of these three peaks and the ratio $I_D/I_G$, Ferrari and Robertson (Phys. Rev. B 61, 14095 (2000)) introduced a three stage model of disorder in carbon materials, which allows for a simple assessment of the Raman spectra of graphene. The early stage leads to nanocrystalline graphite (nc-G phase) from crystalline graphite, the second stage is low tetragonal amorphous carbon (a-C phase), and the third stage is high sp$^3$ tetrahedral amorphous carbon (ta-C phase). These three stages were applied to quantify the impact of deposition on the structural quality of graphene sheets.

DC Sputtering (CoFe and Al)

In accordance with the above-mentioned two configurations, $Co_{70}Fe_{30}$ layers of 4 nm and Al layers of 2 nm were deposited onto the graphene workpiece by DC sputtering at a power of 60 W. According to the prior art configuration, the deposition rate of CoFe and Al is 6.3 nm and 5.6 nm per hour, respectively, whereas according to the embodiment, it is 3.5 nm and 2.5 nm per hour, respectively. Therefore, the embodiment yielded a reduced deposition rate compared to the known method.

Figure 6:
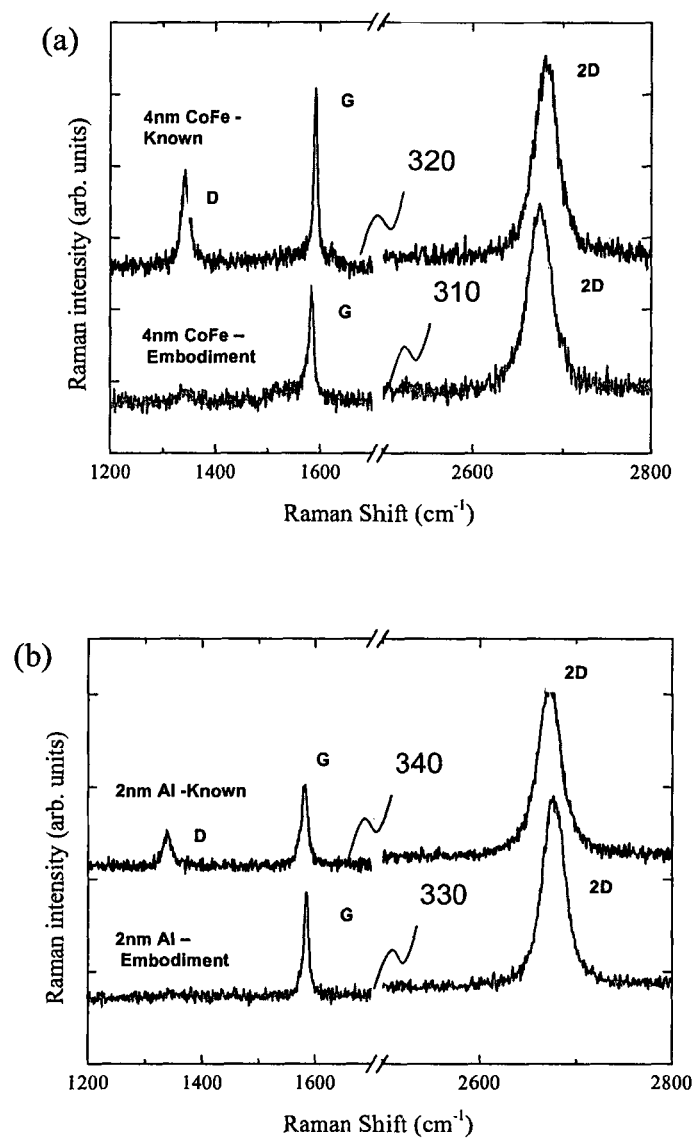
FIG. 6 illustrates Raman spectra of (a) CoFe deposited via a known method and via an embodiment and (b) Al deposited via a known method and via an embodiment.

FIG. 6 (a) shows the Raman spectra of the deposition of 4 nm CoFe layer on the graphene workpiece in accordance with the above-mentioned two configurations. The Raman spectrum 320 of CoFe layer deposited in the known deposition configuration comprises D peak, G peak and 2D peak, whereas the Raman spectrum 310 of CoFe layer deposited in accordance with the embodiment comprises a negligible D peak, G peak and 2D peak. In the known prior art configuration, the sputtered atoms with strong momentum are deposited directly onto the graphene workpiece with high energy and thus induce damage to the SLG. The appearance of the D peak in Raman spectrum 320 indicates that the deposition of CoFe breaks the symmetry of graphene and induces disorder. The in-plane correlation length ($L_a$) of Raman spectrum 320 is calculated by $L_a=C(I_G/I_D)$ to be 6.07 and the disorder level is still good for certain graphene applications. This shows that high Ar gas pressure (20 mTorr) for sputtering can greatly reduce the disorder level as compared to the result of common low Ar gas pressure (3 mTorr) sputtering. The level of damage of graphene can be further reduced once the orientation of the work surface in accordance with an embodiment is utilized together with high Ar gas pressure. In the embodiment, the energy of atoms is greatly reduced when they reach the work surface and thus damage to the graphene is reduced. The Raman spectrum 310 shows a negligible D peak, while the G and 2D peaks preserve their shapes, indicating the graphene structure of the work surface is well preserved. Accordingly, DC sputtering deposition could be used onto graphene when performed in accordance with an embodiment.

The Raman spectra of the deposition of 2 nm Al layers on the graphene workpiece in accordance with the above-mentioned two configurations are shown in FIG. 6 (b). The results are similar to those of CoFe layers. The Raman spectrum 340 of Al layer deposited via the known configuration comprises D peak, G peak and 2D peak, whereas the Raman spectrum 330 of Al layer deposited via the embodiment comprises only G peak and 2D peak. Accordingly, no disorder of graphene is seen from the spectra by using the embodiment; however, disorder of graphene appears in the known prior art configuration. A common adopted method to form AlOx is to deposit Al and then subsequently oxidized it in atmosphere, pure $O_2$, or oxygen plasma. Since AlOx is often used as a tunnel barrier for spintronic devices or a dielectric layer to apply a gate bias, the embodiment thus sheds light on future graphene applications via sputtering.

Figure 7:
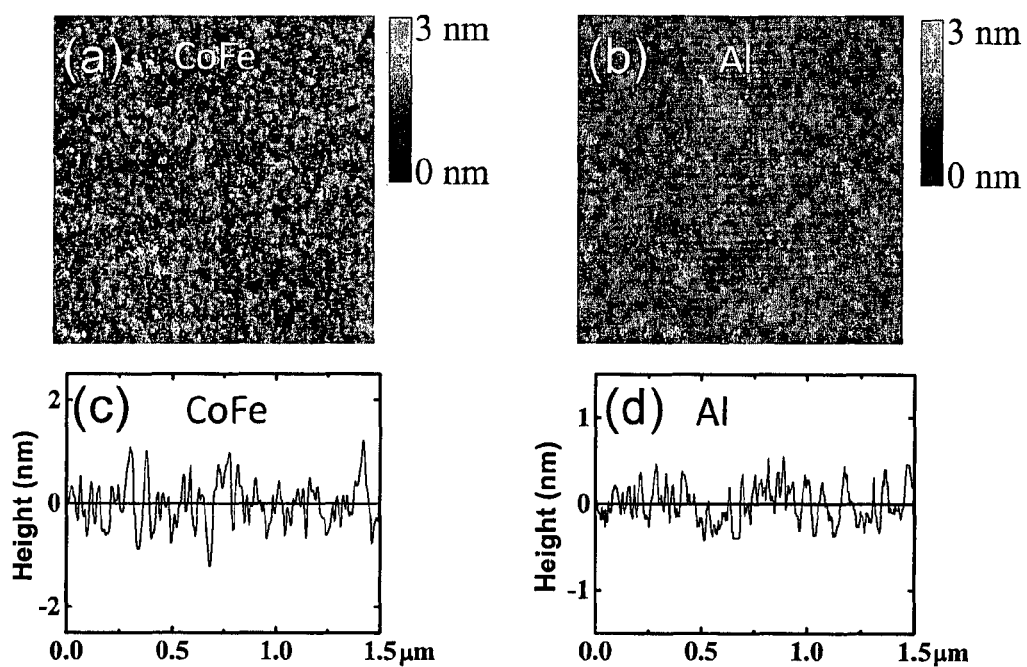
FIG. 7 illustrates AFM images of CoFe ((a) and (c)) and Al ((b) and (d)) on graphene.

The uniformity of the above-deposited materials onto graphene is examined by the atomic force microscopy (AFM) images. FIG. 7 shows AFM of 4 nm CoFe and 2 nm Al on graphene which were deposited via the embodiment with 20 mTorr Ar gas pressure. The mean roughness of CoFe on graphene is 0.432 nm, while that of Al is 0.284 nm. The layers show a good uniformity promising for practical applications.

Simply reducing the sputtering power is not helpful to reduce the damage level of graphene. For example, the CoFe deposition power was reduced from 60 to 23 W for the known prior art sputtering configuration, so that the deposition rate is the same as achieved via the embodiment. The D peak appears in the Raman spectra which is comparable with one seen at 60 W in the same configuration (not shown). The improvement in disorder via the embodiment is attributed to the reduced energy of atoms when they reach the work surface.

Reactive DC Sputtering (MgO)

Reactive DC sputtering is an alternative method to deposit high quality tunnel barriers in a reactive gas mixture with Ar. An MgO layer of 1 nm was deposited onto graphene by DC reactive sputtering at 60 W in a mixture of 30 sccm (standard cubic centimeters per minute) Ar and 1 sccm $O_2$ gas via the embodiment. The deposition rate of DC reactive sputtered MgO via the embodiment was 1 nm per hour.

Figure 8:
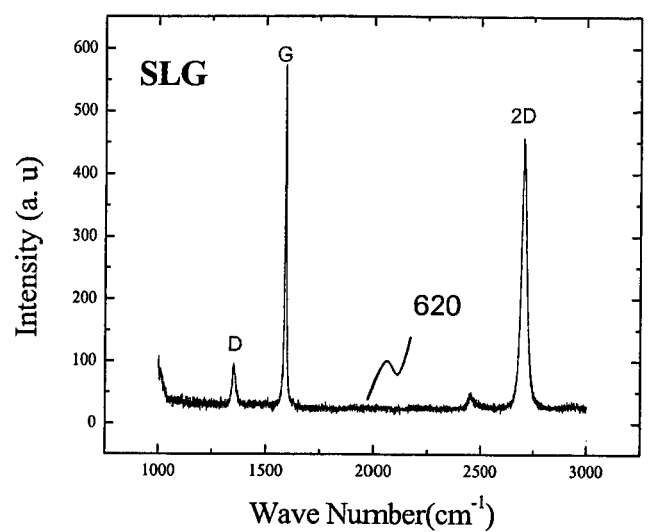
FIG. 8 illustrates Raman spectrum of MgO deposition on graphene using reactive sputtering in accordance with an embodiment.

The Raman spectrum of MgO using reactive DC sputtering via the embodiment is shown in FIG. 8. A small D peak is observed, which comes from the oxygen plasma due to the oxygen gas mixture. The Raman spectrum of MgO layer deposited in the known prior art deposition configuration shows no peak at all and thus indicates a clear amorphization of graphene (not shown). By utilizing the embodiment in high Ar pressure, a better quality of graphene is obtained after the oxide deposition, which will enable the use of various oxide materials in graphene devices by sputtering. Especially, high spin filtering MgO tunnel barriers are of great importance for spintronic applications. By replacing the $O_2$ gas with the $N_2$ or other reactive gases, various nitrides and other materials can be explored with graphene using reactive sputtering.

Figure 9:
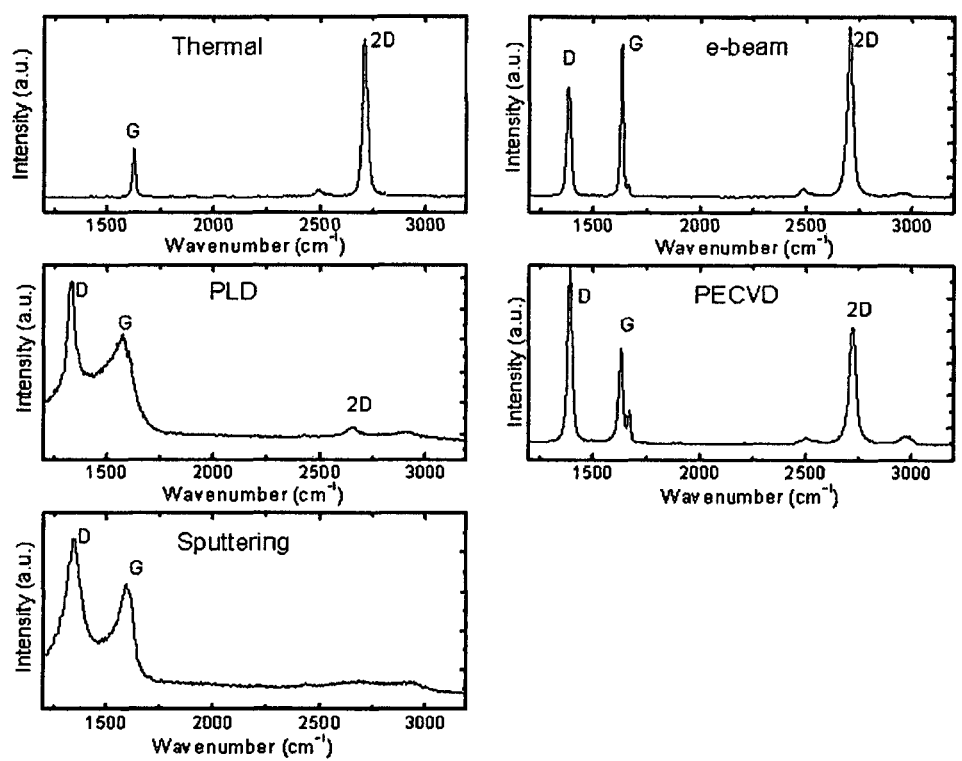
FIG. 9 illustrates Raman spectra of deposition on single layer graphene by different known methods.

For comparison, various known methods were tried to deposit a layer onto the SLG and the level of damage of graphene was studied by Raman spectroscopy. 3 nm $SiO_2$, 2 nm $TiO_2$, 2 nm Cr, 2 nm Cr and 2 nm Cu have been deposited onto SLG by plasma enhanced chemical vapor deposition (PECVD), pulsed laser deposition (PLD), thermal evaporation, e-beam evaporation, and sputtering with their typical deposition parameters, respectively. In sputtering, 3 mTorr Ar gas pressure and 60 W were used. As can be seen in FIG. 9, only known thermal evaporation gives rise to a negligible D peak after the deposition. A significant D peak appears with the other known methods, such as PLD, e-beam evaporation, PECVD, and sputtering. Among these known methods, PLD and sputtering induce the most significant disorder. According to this model, for e-beam evaporation and PECVD, the disorder level is moderate and the amorphization is at the first stage. A second stage amorphization occurs to graphene with the PLD and sputtering processes.

An advantage of some embodiments is to enable the use of sputtering in depositing layers (e.g. thin films or coatings) onto graphene. Graphene is considered as a very good candidate for transparent films and interconnects. Although graphene can be an ideal material for transparent contacts, it still needs to be fabricated with Indium Tin Oxide (ITO) to form display panels. Currently, display industries are using sputtering to deposit ITO. By using the above-described embodiments, graphene can be fully utilized in forming transparent interconnects with conventional ITO fabrication equipments.

It will be appreciated by a person skilled in the art that numerous variations and/or modifications may be made to one or more of the above-described embodiments without departing from the spirit or scope of the invention as broadly described in the appended claims. The above-described embodiments are, therefore, to be considered in all respects to be illustrative and not restrictive.

The invention claimed is:

1. A method for depositing a layer onto a workpiece using plasma, the method comprising:
    arranging the workpiece and a source material inside a vacuum chamber;
    applying energy to the source material to cause atoms of the source material to be ejected from a surface of the source material into a plasma;
    orientating the workpiece such that a work surface of the workpiece faces away from the source material and lies in a different plane compared to the surface of the source material to prevent direct propagation of the ejected atoms from the source material to the work surface of the workpiece and to permit deposition of the layer onto the workpiece by ejected atoms which impact the work surface after colliding with particles of the plasma.

2. The method of claim 1, wherein the step of applying comprises:
    introducing the plasma into the vacuum chamber; and
    electrically charging the source material to cause ions of the plasma to bombard the surface of the source material to cause atoms of the source material to be ejected from the surface of the source material.

3. The method of claim 2, wherein the step of introducing comprises:
    injecting a gas into the vacuum chamber; and
    electrically charging the gas to generate the plasma.

4. The method of claim 3, wherein a pressure in the vacuum chamber is selected from group consisting of: 5 to 50 mTorr, 10 to 40 mTorr, 15 to 35 mTorr, 20 to 30 mTorr, 15 to 25 mTorr, 25 to 50 mTorr, 30 to 40 mTorr.

5. The method of claim 1, wherein the step of applying comprises causing energized particles from an energy source to bombard the surface of the source material to form the plasma and cause atoms of the source material to be ejected from the surface.

6. The method of claim 1, wherein the step of applying comprises shining a laser onto the surface of the source material to cause atoms of the source material to be vaporized into a plume of plasma.

7. The method of claim 1, wherein the step of applying comprises applying an electric arc to the surface of the source material to cause atoms of the source material to be ejected from the surface into plasma discharged by the arc.

8. The method of claim 1, further comprising:
    orientating the workpiece with respect to the source material to permit direct propagation of the ejected atoms from the source material to the work surface of the workpiece to deposit a further layer onto the workpiece.

* * * * *